United States Patent [19]
Banwell et al.

[11] Patent Number: 4,796,266
[45] Date of Patent: Jan. 3, 1989

[54] LASER DRIVER CIRCUIT WITH DYNAMIC BIAS

[75] Inventors: Thomas C. Banwell, Madison Borough; William E. Stephens, Basking Ridge, both of N.J.

[73] Assignee: Bell Communications Research, Inc., Livingston, N.J.

[21] Appl. No.: 135,916

[22] Filed: Dec. 21, 1987

[51] Int. Cl.$^4$ .............................................. H01S 3/00
[52] U.S. Cl. ...................................... 372/38; 372/29; 372/26
[58] Field of Search ........................ 372/26, 29, 38, 34

[56] References Cited

U.S. PATENT DOCUMENTS

| | | | |
|---|---|---|---|
| 4,009,385 | 2/1977 | Sell | 372/26 |
| 4,081,670 | 3/1978 | Albanese | 250/199 |
| 4,359,773 | 11/1982 | Swartz et al. | 372/26 |
| 4,734,910 | 3/1988 | Izadpanah | 372/18 |

OTHER PUBLICATIONS

P. W. Shumate, Jr., F. S. Chen, and P. W. Dorman, "GaAlAs Laser Transmitter for Lightwave Transmission Systems", *Bell System Technical Journal*, vol. 57, No. 6, Jul.-Aug. 1978, pp. 1823-1836.

D. W. Smith, "Laser Level-Control Circuit for High--Bit-Rate Systems Using a Slope Detector", *Electronics Letters*, Nov. 23, 1978, vol. 14, No. 24, pp. 775-776.

"Optical Fibre Communication Systems", edited by C. P. Sandbank, John Wiley & Sons, 1980, pp. 210-215.

*Primary Examiner*—Léon Scott, Jr.
*Attorney, Agent, or Firm*—James W. Falk; Stephen M. Gurey

[57] ABSTRACT

The laser driver circuit of the invention stabilizes the low operating output power level of a laser (301) modulated by a digital input signal, at a fixed preset value $L_o$, by automatically adjusting the bias current, $I_b$, supplied to the laser to compensate for variations in the laser threshold due to temperature changes and aging. The circuit includes a fast photodetector (401) which is responsive to the modulated light output of the laser. The photodetector output is combined (306, 308) with a data sensitive reference signal ($i_r$) and a preset level setting input signal ($i_o$) which is equal to $\eta$ times the desired low operating output power level $L_o$, where $\eta$ is the coupling coefficient of the photodetector. Reference signal $i_r$ varies in accordance with the input data between a zero value when the input is ZERO and a value equal to what is estimated to be the photodetector output due to the data modulation when the input is ONE. The combination of the photodetector output, the data sensitive reference signal $i_r$, and the level setting input signal $i_o$, is a difference signal proportional by a factor of $\eta$ to the difference between the desired low operating output level and the estimated operating output level. This difference signal is amplified by an operational transconductance amplifier (402) having a large multiplicand, $A_o$, when the input data is ZERO and a substantially smaller multiplicand, $A_1$, when the input data is ONE. The output of the amplifier drives an integrating low frequency error amplifier 309 which generates at its output the laser bias current, $I_b$, which is driven to a value such that the low operating power level of the laser is equal to $L_o$ as determined by the level setting input signal $i_o$.

12 Claims, 3 Drawing Sheets

LASER DRIVER CIRCUIT WITH DYNAMIC BIAS

BACKGROUND OF THE INVENTION

This invention realtes to laser circuitry, and more particularly to a laser driver circuit for modulating the light output of the laser between high and low light output levels in response to an input digital signal and which maintains the low light output level of a laser at the same fixed set level regardless of laser to laser variations and regardless of changes in laser characteristics due to aging and temperature effects.

In order to transmit digital signals over optical facilities, lasers are typically used to convert input electrical signals into modulated light waves. By modulating the current through the laser by the digital electrical signal, the light output of the laser is modulated between a low output power level, $L_0$, and a high output power level, $L_1$, in accordance with the ONEs and ZEROes of the input digital signal. This light modulated signal when coupled to an optical fiber for transmission, can be detected by a receiver which can convert the light signal back to an electrical signal by distinguishing the ONEs and ZEROes in accordance with the varying intensity of the received optical signal. It is generally desirable to bias the laser for the low output light level with a current, $I_b$, that is as close to the laser threshold point as possible, the threshold being the point at which the laser commences to produce a stimulated light emission. The laser is then modulated with a modulating current, $I_m$, that has a magnitude so that the extinction ratio, $\gamma$, defined as the ratio of $L_1/L_0$, is large enough to enable the receiver to accurately distinguish between a received ONE and ZERO. If the laser is biased too far below threshold, the light output will not be linearly related to the magnitude of modulating current which will degrade receiver error performance due to the reduction and uncertainty in the level $L_1$. In addition, a bias too far below threshold will degrade the rise time and shape of the transition between levels $L_0$ and $L_1$. Similarly, a bias too high above threshold does not fully utilize the linear dynamic range of the laser and will also degrade receiver error performance due to decreased receiver sensitivity to a too high low light output level. Accordingly, it is desirable to bias a laser as close to threshold as possible. Whereas lasers had most often in the past been biased just below threshold, it has recently been found (see for example, S. E. Miller, "Turn-on Jitter in Nearly Single-Mode Injection Lasers," IEEE Journal of Quantum Electronics, Vol QE-22, No. 1, p. 16, January 1986,) that turn-on delay and turn-on jitter can degrade performance and limit the maximum speed at which the laser can be operated. Thus, bias just above the threshold is now most perferable for high speed operation.

One cannot bias a laser with a fixed current, however, since many factors affect laser performance. Particularly, a laser is sensitive to changes in temperature, aging and the data modulated thereon. Furthermore, as the laser is operated, its characteristics may vary. These changing characteristics will affect the laser threshold and the laser efficiency, $\partial L/\partial I$, the slope of the light output power-input current curve. In addition, the characeristics of a laser will vary from device-to-device for a given type of laser. As a result, a bias current selected at one instant for one device, may fall way above or below threshold on another device, or as the laser is operated, thereby seriously affecting performance.

Various prior art techniques and circuits have been devised to stabilize the bias level of a laser. An all electronic circuit is described in U.S. Pat. No. 4,081,670 to A. Albanese, issued Mar. 28, 1978. In this circuit, changes in the junction voltage of a laser are monitored to determine when the laser falls below threshold and to set the bias current. The circuit cannot be used to bias the laser above threshold since the information needed to adjust the bias point would not be present above threshold.

More typical arrangements involve the use of an optical feedback circuit to stabilize the laser. One common circuit is illustrated in FIG. 157 of the text, Optical Fibre Communication Systems, Edited by C. P. Sandbank, John Wiley & Sons, 1980, p. 210. In this system the optical power emanating from the back-facet of the laser is measured by a slow photodetector and the mean output power of the photodetector is adjusted to be a constant. A long string of ZEROes or ONEs in the data pattern, however, will cause the bias level to be adjusted up or down to maintain the constant average measured power. Also, there is no compensation for variations in slope efficiency of the laser and each laser must be individually tuned.

More sophisticated optical feedback circuits estimate the low output power level, $L_0$, to determine the bias current that should be supplied to the laser. One such laser bias control circuit that compensates for changes in threshold due to temperature variations is shown in FIG. 5.20 of the text, Topics in Applied Physics, Semiconductor Devices for Optical Communication, Volume 39, Second Updated Edition, Springer-Verlag, New York, 1982, p. 184. In this circuit the bias is adjusted by the feedback loop so that the average photocurrent generated by a photodetector is held constant with respect to the average of the input driving voltage data pattern. By comparing the data pattern with the photodetector output, control is maintained independent of the duty cycle of the data. Accurate adjustment in the feedback loop is, however, dependent in part upon the coupling coefficient of the photodetector which is responsive to the light output of the laser and upon the laser efficiency, $\partial L/\partial I$. This photodetector coupling coefficient, $\eta$, varies from device to device, and thus this circuit cannot automatically compensate for changes due to device parametric variations. Thus each such circuit must be individually tuned, which is highly labor intensive and disadvantageous for mass production of laser devices for consumer applications. In addition, the circuit does not compensate for changes in slope efficiency.

Another optical feedback circuit is described in "Laser Level-Control Circuit for High-Bit-Rate Systems Using a Slop Detector", Electronics Letters, Vol. 14, No. 24, pp. 775-776, Nov. 23, 1978. In this circuit a low frequency small amplitude signal is superimposed on the laser current when the data is ZERO. The low frequency modulation of the laser is detected by a slow feedback photodiode, the amplitude of the detected low frequency signal being indicative if the $L_0$ light output level is above or below threshold. The mean power is also monitored by the same photodiode so that the $L_1$ output power level can be determined and controlled. This circuit is more complicated than the previously described circuit and does not permit bias above threshold.

A circuit that does not require device-to-device adjustments and does compensate for changes in threshold and slope efficiency due to temperature variations and aging is shown in FIG. 161 of the aforenoted text, Optical Fibre Communication Systems, p. 213. In this circuit the monitored optical waveform is sampled in both the ONE level and ZERO level and compared with preset demanded values and the bias current and modulation current adjusted accordingly. This circuit requires two feedback loops, however, therefore requiring a more complex circuit realization that is difficult to implement at high speeds.

In general, the less complicated prior art circuits provide inadequate allowance for device parametric variations and require stringent manufacturing control to achieve desired performance. Also, the less complicated prior art circuits do not provide correction for changes in slope efficiency. The more complicated prior art circuits that do provide sufficient compensation, have satisfactory performance only at low data rates.

A simple laser drive circuit for modulating the output power of a laser in response to an input digital signal and that maintains the operating point of the laser at a relatively stable point regardless of temperature, aging, and device-to-device variations is desirable for high speed optoelectronic circuits.

SUMMARY OF THE INVENTION

The laser drive circuit of the present invention incorporates optical feedback, as per several of the aforedescribed prior art circuits, to stabilize the low operating output power level, $L_0$, of a laser at a fixed preset value. The feedback circuitry that controls the bias current, $I_b$, of the laser includes a fast photodetector which is responsive to the data modulated light output of the laser. The signal generated by the photodetector is combined with a data sensitive reference signal and a preset level setting input signal equal to $\eta$ times the desired low operating outut power level, $L_0$, where, as aforenoted, $\eta$ is the coupling coefficient of the photodetector. The data sensitive reference signal varies in accordance with the input data between a zero value when the input is ZERO and a value equal to what is estimated to be the photodetector output due to the data modulation when the input is ONE. The combination of the photodetector output, the data sensitive refernce signal, and the level setting input signal is a difference signal proportional by a factor of $\eta$ to the difference between the desired low operating output level and the estimated low operating output level. In accordance with the present invention, this difference signal is amplified in the feedback circuit by a data controlled variable gain amplifier which has a large multiplicand when the input data is ZERO and a substantially smaller multiplicand when the input data is ONE. The output of the amplifier thus deemphasizes the feedback effect of the estimated value of $L_0$ when the input is ONE and more likely to deviate from the desired $L_0$. The output of the variable gain amplifier drives an integrating low frequency error amplifier to complete the feedback loop and which generates at its output the laser bias current which is driven to a value $I_b$ such that the low operating output power level of the laser is equal to $L_0$ as determined by the level setting input signal.

Advantageously, in addition to stabilizing the bias current to compensate for changes in the laser threshold due to temperature and aging effects, the laser driver circuit of the present invention has substantially reduced sensitivity to device parametric variations, such as device to device variations of $\eta$, and substantially reduced sensitivity to variations of the laser efficiency, $\partial L/\partial I$.

DETAILED DESCRIPTION

Figure 1:
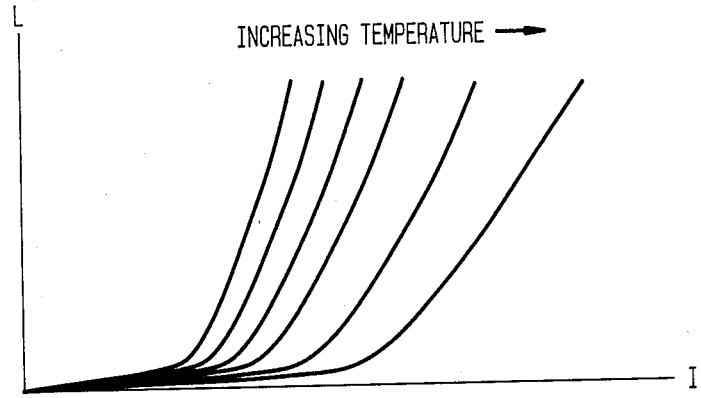
FIG. 1 is a series of output light power (L)-current input (I) characteristics for a typical injection laser which shows the effect of increasing temperature on laser threshold and slope efficiency.

With reference to FIG. 1, the light output (L)-current input (I) characteristics of a typical injection laser at various operating temperatures are shown. As can be noted, at a certain current input, known as the laser threshold, stimulated light emission commences. The particular point at which stimulated emission begins, however, is highly dependent upon temperature and aging of the device. As can be noted from the series of L-I curves in FIG. 1, the first order effect of increasing temperature is an increase in the laser threshold. As the temperature of the device further increases, however, a second order effect is noted, i.e., a decrease in slope efficiency, $\partial L/\partial I$, of the laser which thus requires a larger current increment to effect the same light output increment that can be achieved at a lower temperature. In addition to the effects of temperature on the threshold of the laser, aging will similarly cause the threshold to increase. An additional effect of aging may or may not be a decrease in slope efficiency, depending upon the individual device.

Figure 2:
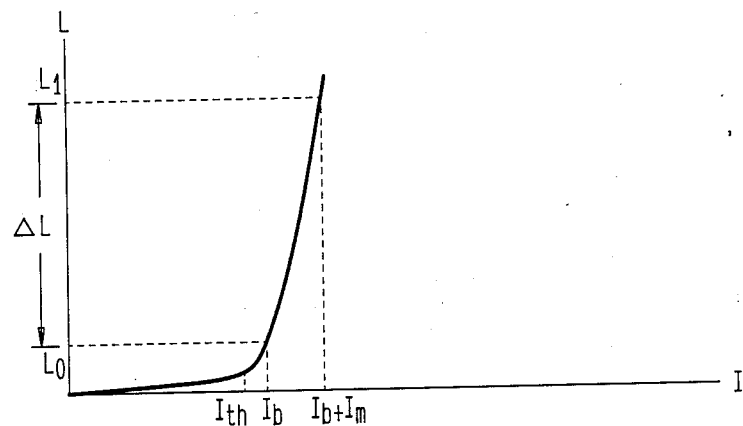
FIG. 2 is the L-I characteristic of a laser at a fixed temperature which shows the relationship between laser threshold, $I_{th}$, bias level, $I_b$, the modulating current, $I_m$, and the laser light output power.

With reference to FIG. 2, the L-I characteristic of a laser at a fixed temperature is shown. As aforenoted, it is desired to bias the laser with a current, $I_b$, that is above the threshold level, $I_{th}$. The light output when biased with $I_b$ is $L_0$. When an input digital signal modulates the laser current so that an additional current $I_m$ is supplied to the laser for each digital ONE in the input signal, the light output increases by $\Delta L$, which is approximately the product of $\partial L/\partial I$ times $I_m$, to $L_1$. Typically, the modulating current is selected so that the the extinction ratio, $\gamma$, equal to $L_1/L_0$, is approximately 10 to assure satisfactory receiver noise performance.

Figure 3:
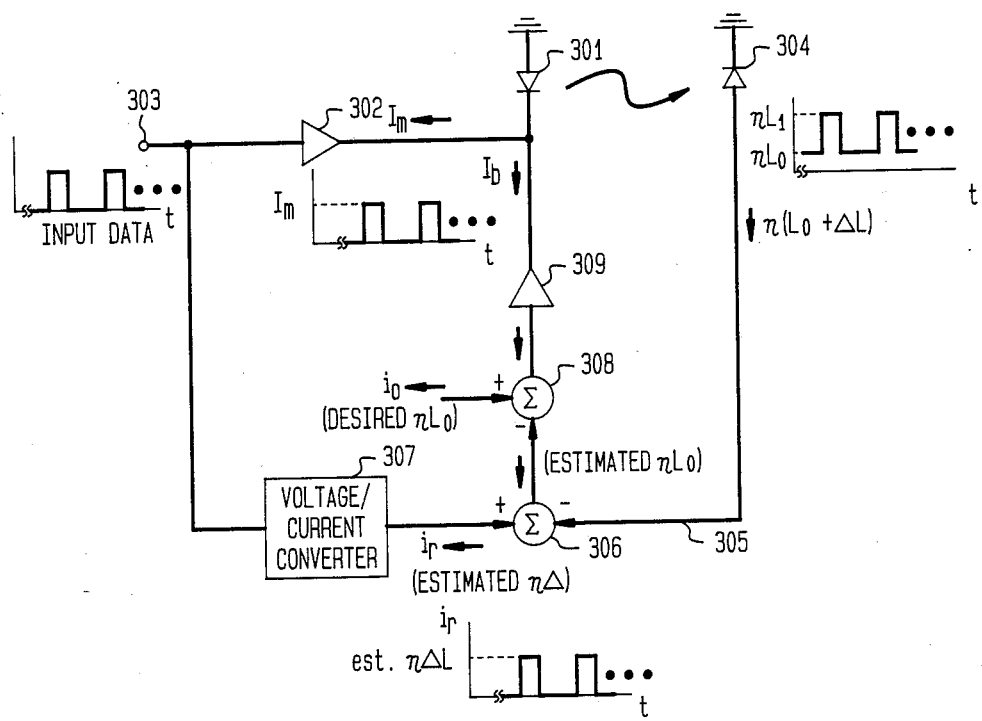
FIG. 3 is a block diagram of a prior art laser driver circuit.

As previously described, various prior art laser driver circuits are known to compensate for temperature variations by maintaining $L_0$ at the same preselected level regardless of the input data pattern. The architecture of one such circuit, the above-cited circuit in FIG. 5.20 in the text, Topics in Applies Physics, Semiconductor Devices for Optical Comunications, is shown in FIG. 3. With reference to FIG. 3, the current through laser 301 consists of the sum of the bias current, $I_b$, being supplied and regulated by means of a feedback circuit, and the modulating current, $I_m$, supplied to laser 301 through shaping amplifier 302 from the data signal on input 303. Shaping amplifier commonly may be a differential amplifier which supplies either zero additional current to laser 301 when the input on 303 is ZERO or $I_m$ additional current when the input on 303 is ONE. The laser current thus varies between $I_b$ and $I_b+I_m$ in accordance with the data on input 303 while the light output varies correspondingly between $L_0$ and $L_1$. The light output of laser 301 is detected by a slow photodetector 304 which produces on lead 305 a feedback current which is proportional to the low level output of the laser, equal to $\eta L_0$, with a superimposed variation, $\eta\Delta L$, due to the modulation. As previously noted, $\eta$ is equal to the coupling coefficient between the laser 301 and photodetector 304. This feedback current is combined at summing node 306 with a reference current $i_r$. The current $i_r$ is derived from the modulating data signal on input 303 through an adjustable voltage-to-current converter 307 such as a current steering gate, to be equal in magnitude, when the input is ONE, to what is estimated to be $\eta\Delta L$. The current $i_r$ thus varies between ZERO when the input data is ZERO and the estimated $\eta\Delta L$ when the input is ONE. The resultant current, being equal to what is estimated to be $\eta L_0$, is combined at summing node 308 at the input of an integrating low frequency error amplifier 309 with level setting input current, $i_0$. Current $i_0$ is set based on the performance of the class of the laser being employed to correspond to what the low level light output of the laser, $L_0$ times $\eta$, $\eta L_0$, is desired to be. The feedback action of the loop thereby maintains the average value of the current through photodetector 304 equal to the desired $\eta L_0$ plus the average value of $i_r$. If $i_r$ is chosen, by means of the voltage-to-current converter 307, to equal $\eta\Delta L$ when the input is ONE, the low level laser output will correspond to the desired $\eta L_0$.

Analytically, $L_0$ is given as follows:

$$L_0 = \frac{i_o}{\eta} + \frac{d}{\eta}[i_r - \eta\Delta L] \quad (1)$$

where d is the duty cycle of the modulating data signal. As aforenoted, if $i_r$ is chosen to cancel the $\eta\Delta L$ term due to the modulation, then the low level laser output corresponds to the desired $i_0/\eta$. Such setting of $i_r$ is accomplished at manufacture by adjusting each circuit by examining $I_b$ as a function of time in response to a low frequency data input and adjusting $i_r$ until $I_b$ has no data dependence. Although such adjustment procedures may be satisfactory for low quantity, expensive laser modules, such procedures cannot be efficiently performed on inexpensive mass produced devices designed for incorporation into consumer products. The laser driver circuit of the present invention is less sensitive to precise adjustment and accordingly, as will be described, be more amenable to inclusion in such low cost laser packages.

The aforedescribed prior art laser driver circuit does correct for variations in the laser threshold due to aging or temperature as follows. As the laser threshold changes due to aging or temperature, the low level light output $L_0$ assumes a different value. Assuming that the slope of the L-I curve remains constant so that $\Delta L$ remains unchanged, $\eta L_0$ similarly changes to produce, when compared with the fixed input desired $\eta L_0$, error signal at the input to amplifier 309. The resultant error signal drives $I_b$ in such a direction to force $L_0$ back to the original fixed and desired value.

Problems arise with this prior art circuit when in fact the slope efficiency $\partial L/\partial I$ does change due to temperature effects causing variations in $\Delta L$. Furthermore, small variations in $\eta$ can create significant variations in $L_0$. With respect to the former if $\Delta L$ does vary, the error signal at the input to amplifier 309 will contain data dependent fluctuations not associated with $L_0$ which will cause $L_0$ to shift to an undesired level above or below threshold. With respect to the latter, in state of art packaging, $\eta$ is well controlled. It is however expensive and impractical to maintain such control in low cost packages. It is desirable, therefore, to tolerate fluctuations in $\eta$ either from device-to-device or within one device. A circuit that is tolerant of mistracking between $i_r$ and $\eta\Delta L$ is thus advantageous for low cost laser packages.

With reference to equation (1), it can be noted that $L_0$ is extremely sensitive to variations of the terms within the brackets. Since $i_r$ and $\eta\Delta L$ are typically greater than ten times the magnitude of $i_0$, small relative variations in $i_r$ and $\eta\Delta L$ will dominate $L_0$. By differentiating equation (1) with respect to $\eta$, the percent change in $L_0$ relative to a percent change in $\eta$ is given by:

$$\frac{\delta L_0/L_0}{\delta \eta/\eta} = -1 - \frac{d\Delta L}{L_0} \quad (2)$$

Since $\Delta L/L$ is typically 10, and for a duty cycle of 0.5, the second term contributes 5 which means that for a 10% variation in $\eta$, there will be a 60% variation in $L_0$ which would be catastrophic in laser operation. Similarly by differentiating equation (1) with respect to $\Delta L$, the percent change in $L_0$ relative to a percent change in $\Delta L$ is given by:

$$\frac{\delta L_0/L_0}{\delta \Delta L/\Delta L} = -\frac{d\Delta L}{L_0} \quad (3)$$

which for the same values hereinabove is equal to 5. Thus a 10% variation in $\Delta L$ will produce an unacceptable 50% variation in $L_0$.

Figure 4:
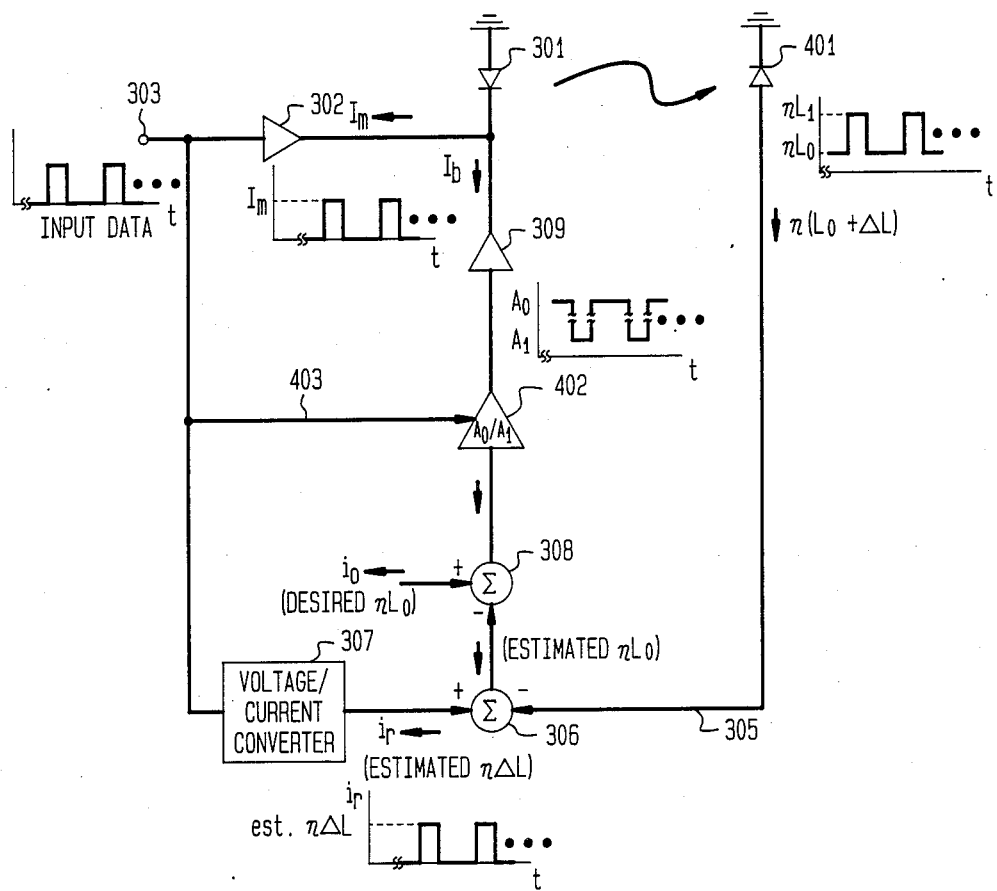
FIG. 4 is a block diagram of the laser driver circuit of the present invention.

With reference to FIG. 4, the circuit architecture of the laser driver circuit of the present invention is shown. Similar numerical designations are given to those elements common to FIGS. 3 and 4. In the circuit of the present invention, an improvement of the prior art circuit of FIG. 3, sensitivities to variations in both $\eta$ and $\Delta L$ are substantially reduced, together with the need for precise factory adjustment of the reference current, $i_r$. Accordingly, the circuit architecture is particularly well suited for incorporation into low cost laser packages where the cost factor makes it impractical to necessitate high tolerance components and labor intensive procedures in the manufacturing process.

The present invention makes note of the fact that the estimated $\eta L_0$ present at the output of summing node 306 in both FIGS. 3 and 4 is a good estimate of the low level of the laser, $L_0$, when the input data is ZERO. When the input data is ONE, however, and $I_m$ is supplied to the laser 301 and a non-zero $i_r$ is present as an input to node 306, the combination of the feedback signal from the photodetector and $i_r$ is a poor estimate if $i_r$ does not equal $\eta\Delta L$ due to either variations in $\eta\Delta L$ or maladjustment of $i_r$. In accordance with the present invention, the influence of the error signal on the laser bias, $I_b$, is reduced when the data input is ONE and the laser output is at its high level output. This is achieved by incorporating a variable gain amplifier 402 at the input to error amplifier 309, the gain of which is controlled by the input data on lead 303 as input to amplifier 402 via lead 403. In particular, variable gain amplifier 402 may be an operational transconductance amplifier (OTA) using such principles as in an RCA 3080 OTA. The gain of amplifier 402 is designated as $A_0$ when the data input is ZERO and $A_1$ when the data input is ONE, where the gain $A_1$ is much less than the gain $A_0$ so as to reduce the feedback on $I_b$ when the input is ONE.

The laser driver circuit of the present invention thus includes a laser 301 biased by a current $I_b$. The data on input 303 supplies an additional current $I_m$ through shaping amplifier 302 in response to each ONE in the data stream. Shaping amplifier may be, as before, a differential amplifier. The light emitted by laser 301 is detected by a high speed photodetector 401 which generates a feedback signal, $\eta L_0 + \eta \Delta L$, which is combined at summing node 306 with a reference current, $i_r$, generated in response to the data through voltage-to-current converter 307 and equal when the input is ONE to what is estimated to be $\eta \Delta L$. Again, voltage-to-current converter 307 may be a current steering gate. The output of node 306, equal to the estimated $\eta L_0$, is combined at summing node 308 with a level setting input current, $i_0$, set to the desired $\eta L_0$ level. The difference between this desired $\eta L_0$ and the estimated $\eta L_0$, which, as aforenoted, is a "good" estimate when the data is ZERO and a "poor" estimate when the data is ONE, is amplified by OTA 402 by an amplification factor $A_0$ or $A_1$ as determined by the ONES and ZEROes of the of the input data 303. The output of OTA 402 is input to integrating low frequency error amplifier 309 to generate at its output the desired bias current, $I_b$.

As per the prior art circuit in FIG. 3, the feedback action of the circuit drives the bias level of the laser to a point such that the estimated $\eta L_0$ equals the desired $\eta L_0$ at the input to summing node 308. Unlike the prior art circuit of FIG. 3, however, which only requires a low speed photodetector 304, the circuit of the present invention requires a high speed photodetector 401 operable as fast or greater than the input data bit rate so that the signal fed back to the input of OTA 402 is in synchronization with the data at 303.

The effect of OTA 402 on desensitizing the circuit to variations in $\eta$, $\Delta L$ and $i_r$ is best demonstrated by examining the equation for $L_0$ in terms of the circuit parameters:

$$L_0 = \frac{i_0}{\eta} + \frac{dA_1}{dA_1 + (1-d)A_0} \cdot \frac{1}{\eta}[i_r - \eta \Delta L] \quad (4)$$

For $A_1, A_0 > 1$ and $A_1 << A_0$, as in a typical example of $A_1 = 1000$ and $A_0 = 20,000$, the influence of the second term on $L_0$ is reduced approximately ten fold for $d = 0.5$. The implication, therefore, is that the need for matching $i_r$ precisely to $\eta \Delta L$ can be reduced ten fold and the circuit can tolerate 10% matching therebetween instead of 1% which would be required in the prior art. Thus manufacture is substantially easier and less costly.

Variations in $L_0$ with respect to variations in $\eta$ are given by:

$$\frac{\delta L_0 / L_0}{\delta \eta / \eta} = -1 - \frac{dA_1}{dA_1 + (1-d)A_0} \cdot \frac{\Delta L}{L_0} \quad (5)$$

The contribution of the second term can thus be reduced to a level commensurate to the intrinsic "−1" term. Thus, for the numerical example of the prior art, and the values for $A_1$ and $A_2$ noted above, equation (5) equals approximately −1.5 instead of −6. Accordingly, a 10% variation in $\eta$ will produce an acceptable 15% variation in $L_0$ as opposed to a catastrophic 60% variation in the prior art circuit. Significantly, this means that $\eta$ need not be controlled as rigidly during manufacture.

Similarly, variations in $L_0$ with respect to variations in $\Delta L$ are given by:

$$\frac{\delta L_0 / L_0}{\delta \Delta L / \Delta L} = \frac{-dA_1}{dA_1 + (1-d)A_0} \cdot \frac{\Delta L}{L_0} \quad (6)$$

For the same numerical example, a 10% change in $\Delta L$ will induce only a 5% variation in $L_0$ as opposed to 50% in the prior art circuit. The circuit of the present invention thus desensitizes the effect of a change of $\Delta L$ due to a change in slope efficiency of the L-I characteristic by a useful amount to a useful extent.

Advantageously, the use of an amplifier having a data controlled gain as opposed to a switch which would interrupt input to error amplifier 309 when the data is ONE, enables feedback to be maintained at all times in the circuit, even in the presence of a long string of input ONEs. For such a long string of input ONEs, the circuit, therefore, functions as the prior art circuit of FIG. 3.

The above described embodiment is illustrative on the principles of the present invention. Other embodiments may be devised by those skilled in the art without departing from the spirit and scope of the invention.

What is claimed is:

1. A laser driver circuit for modulating the light output power of a laser between a desired predetermined low output power level and a high output power level in response to the ZEROes and ONEs, respectively, of an input digital signal comprising.
   a photodetector for producing a feedback signal proportional to the light output of the laser,
   means for deriving a reference signal from the input digital signal, means for combining the photodetector feedback signal, the reference signal and a level setting input signal having a value determined by the desired predetermined low output power level of the laser, to produce an error signal porportional to the difference between the desired predetermined low output power level of the laser and the low output power level detected by said photodetector, and
   an integrating low frequency error amplifier responsive to said error signal for generating a bias current to the laser to maintain the low output power level at the desired predetermined value,
   characterized in that
   said laser driver circuit further comprises a variable gain amplifier connected between said combining means and said error amplifier, said variable gain amplifier having a gain controlled by the input digital signal, the gain of said variable gain amplifier being a first value when the input digital signal is ONE and a second value when the input digital signal is ZERO.

2. A laser driver circuit in accordance with claim 1 wherein said photodetector is a fast photodetector rapidly responsive to the light output of the laser.

3. A laser driver circuit in accordance with claim 1 wherein the gain of said variable gain amplifier when the input digital signal is ZERO is substantially greater than the gain when the input digital signal is ONE.

4. A laser driver circuit in accordance with claim 3 wherein said variable gain amplifier is an operatinal transconductance amplifier.

5. A laser driver circuit for modulating the light output power of a laser between a desired predetermined low output power level $L_0$ and a high output power level $L_1$ in response to the ZEROes and ONEs, respectively, of an input digital signal comprising,
- a photodetector for producing a feedback signal proportional to the light output of the laser,
- means for deriving a reference signal that varies between zero and a predetermined value in accordance with the ZEROes and ONEs of the input signal, the value of said reference signal when said input signal is ONE being substantially equal to the signal produced by said photodetector due to the modulation of the laser,
- means for combining said feedback signal, said reference signal and a level setting input signal having a value determined by the desired predetermined low output level $L_0$ to produce an error signal related to the difference between the desired low output level $L_0$ and the low output level detected by said photodetector,
- a variable gain amplifier for amplifying said error signal by a first gain factor when the input digital signal is ZERO and a second gain factor when the input digital signal is ONE, and
- an integrating low frequency amplifier and responsive to the amplified error signal for supplying a bias current to the laser which maintains the low output power level of the laser at $L_0$.

6. A laser driver circuit in accordance with claim 5 wherein said photodetector is a fast photodetector which responds rapidly to the light output of the laser.

7. A laser driver circuit in accordance with claim 5 wherein said first gain factor is substantially greater than said second gain factor.

8. A laser driver circuit in accordance with claim 7 wherein said variable gain amplifier is an operational transconductance amplifier.

9. In combination,
an injection laser,
- means for biasing said laser with a bias current so that the laser produces a light output at a desire predetermined output power level $L_0$,
- means for supplying a predetermined additional current to said laser when a digital input signal is ONE to increase the laser output power to $L_1$, the laser output power modulating between $L_0$ and $L_1$ in accordance with the ZEROes and ONEs, respectively, of the input signal,
said means for biasing said laser comprising:
- a photodetector for producing a feedback signal proportional to the light output of the laser,
- means for deriving a reference signal that varies between zero and a predetermined value in accordance with the ZEROes and ONEs of the input signal, the value of said reference signal when said input signal is ONE being substantially equal to the signal produced by said photodetector due to the modulation of the laser,
- means for combining said feedback signal, said reference signal and a level setting input signal having a value determined by the desired predetermined low output level $L_0$ to produce an error signal related to the difference between the desired low output level $L_0$ and the low output level detected by said photodetector,
- a variable gain amplifier for amplifying said error signal by a first gain factor when the input digital signal is ZERO and a second gain factor when the input digital signal is ONE, and
- an integrating low frequency amplifier responsive to the amplified error signal for supplying said bias current.

10. The combination in accordance with claim 9 wherein said photodetector is a fast photodetector which responds rapidly to the light output of the laser.

11. The combination in accordance with claim 9 wherein said first gain factor is substantially greater than the said second gain factor.

12. The combination in accordance with claim 11 wherein said variable gain amplifier is an operational transconductance amplifier.

* * * * *